United States Patent
Patel et al.

(10) Patent No.: US 7,126,821 B2
(45) Date of Patent: Oct. 24, 2006

(54) VENTILATED CASING FOR AN ELECTRONIC DEVICE

(75) Inventors: Chandrakant D. Patel, Fremont, CA (US); Wade D. Vinson, Magnolia, TX (US); Rich Bargerhuff, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 10/990,181

(22) Filed: Nov. 16, 2004

(65) Prior Publication Data

US 2006/0104030 A1    May 18, 2006

(51) Int. Cl.
*H05K 7/20* (2006.01)

(52) U.S. Cl. .............. 361/697; 361/687; 361/695; 415/119; 415/213.1

(58) Field of Classification Search ........... 361/687, 361/692–698, 702, 710, 732, 784; 165/80.3, 165/121, 122, 185; 415/53.1, 119, 175, 213.1; 454/184; 257/712, 713, 722, 724; 174/16.1, 174/16.2
See application file for complete search history.

(56) References Cited

U.S. PATENT DOCUMENTS

| | | | |
|---|---|---|---|
| 4,859,888 A * | 8/1989 | Ohbayashi et al. ....... 310/68 R |
| 5,177,666 A | 1/1993 | Bland et al. |
| 6,034,870 A * | 3/2000 | Osborn et al. ............. 361/690 |
| 6,046,921 A * | 4/2000 | Tracewell et al. ......... 363/141 |
| 6,421,240 B1 | 7/2002 | Patel et al. |
| 6,526,333 B1 | 2/2003 | Henderson et al. |
| 6,601,168 B1 | 7/2003 | Stancil et al. |
| 6,768,633 B1 * | 7/2004 | Chuang .................... 361/679 |
| 6,836,030 B1 | 12/2004 | Smith et al. |
| 6,903,928 B1 * | 6/2005 | Lopatinsky et al. ........ 361/697 |
| 6,967,842 B1 * | 11/2005 | Aoki et al. ................ 361/701 |
| 2004/0101018 A1 * | 5/2004 | Leijenaar et al. .......... 372/107 |
| 2004/0202540 A1 * | 10/2004 | Tamagawa et al. ......... 415/206 |
| 2005/0053468 A1 * | 3/2005 | Kuan .......................... 417/32 |
| 2006/0012955 A1 * | 1/2006 | Vinson et al. .............. 361/695 |

* cited by examiner

*Primary Examiner*—Michael Datskovskiy
(74) *Attorney, Agent, or Firm*—Richard P. Lange

(57) ABSTRACT

The present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The fan has a blade, a motor and an air guiding portion positioned near the blade. The air guiding portion has a first mode resonance frequency that is greater than the rotational frequency of the fan.

25 Claims, 3 Drawing Sheets

VENTILATED CASING FOR AN ELECTRONIC DEVICE

FIELD OF THE INVENTION

The present invention relates to a ventilated casing for an electronic device and particularly, although not exclusively, to a casing for an electronic device having a high speed and high pressure fan.

BACKGROUND OF THE INVENTION

The ongoing performance increase of electronic devices usually requires an increase in device density. Large numbers of single electrical components are integrated to form an integrated component and many of such integrated components are placed into relatively small cases such as the cases of computer servers, laptop computers or other electronic devices.

For example, each casing for a server unit may be a narrow blade and a large number of such blades are positioned in close proximity in dedicated racks. A new generation of such blades has a thickness of only 1 U which corresponds to 1.75 inches or 4.445 cm. For example, a standard rack of 187 cm height is suitable to store 42 of such server blades on top of each other. Alternatively, the server blades may be vertical blades having a width of 1 U or less.

Such narrow blade servers increase the number of server components that may be placed in the rack if the package density of the electronic components in each casing can be increased. In order to guarantee satisfactory operation of the closely packed electronic components confined in such small spaces, heat developed by the electronic components needs to be dissipated.

Fans are usually used to dissipate heat developed by the electronic components of electronic server units. Fans of conventional electronic server units often have a normal operation speed which is only approximately 3600 rpm. However, if the package density and therefore the amount of heat that is generated per volume is further increased, higher mass flow is required to ensure that the electronic components are not overheated. Further, because of the increased package density, the flow resistance is also increased and a higher pressure needs to be provided in order to enable the higher mass flow and therefore avoid overheating. Accordingly, there is a need for an advanced technical solution.

SUMMARY OF THE INVENTION

Briefly, the present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The high speed fan has a blade, a motor and an air guiding portion positioned near the blade. The air guiding portion has a first mode resonance frequency that is greater than the rotational frequency of the fan.

The invention will be more fully understood from the following description of embodiments of the ventilated casing. The description is provided with reference to the accompanying drawings.

DETAILED DESCRIPTION OF EMBODIMENTS

Figure 1A:
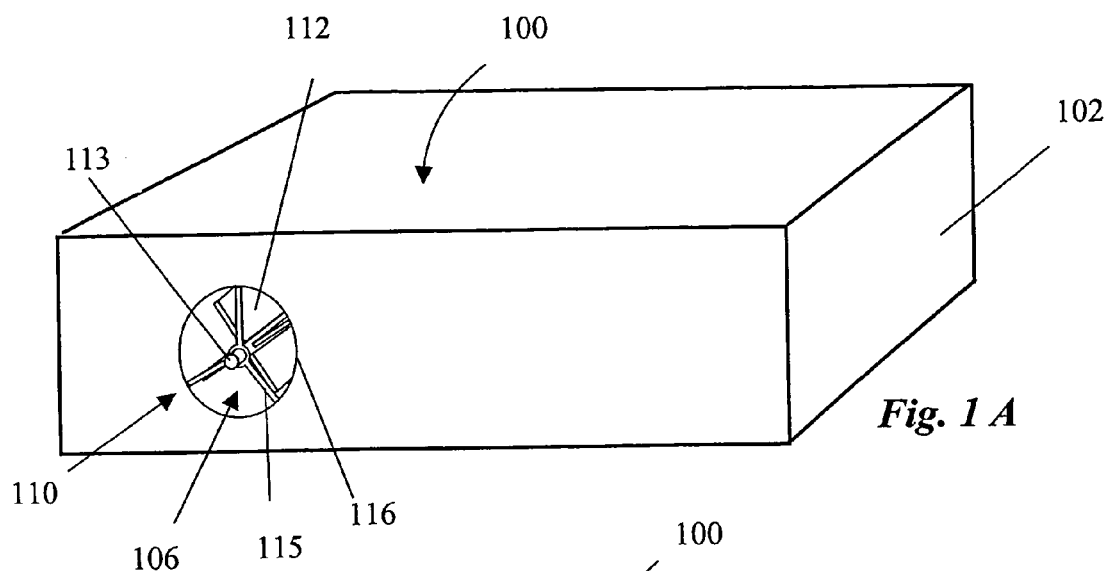
FIG. 1A is a perspective view of a ventilated casing for an electronic device according to an embodiment of the present invention.
Figure 1B:
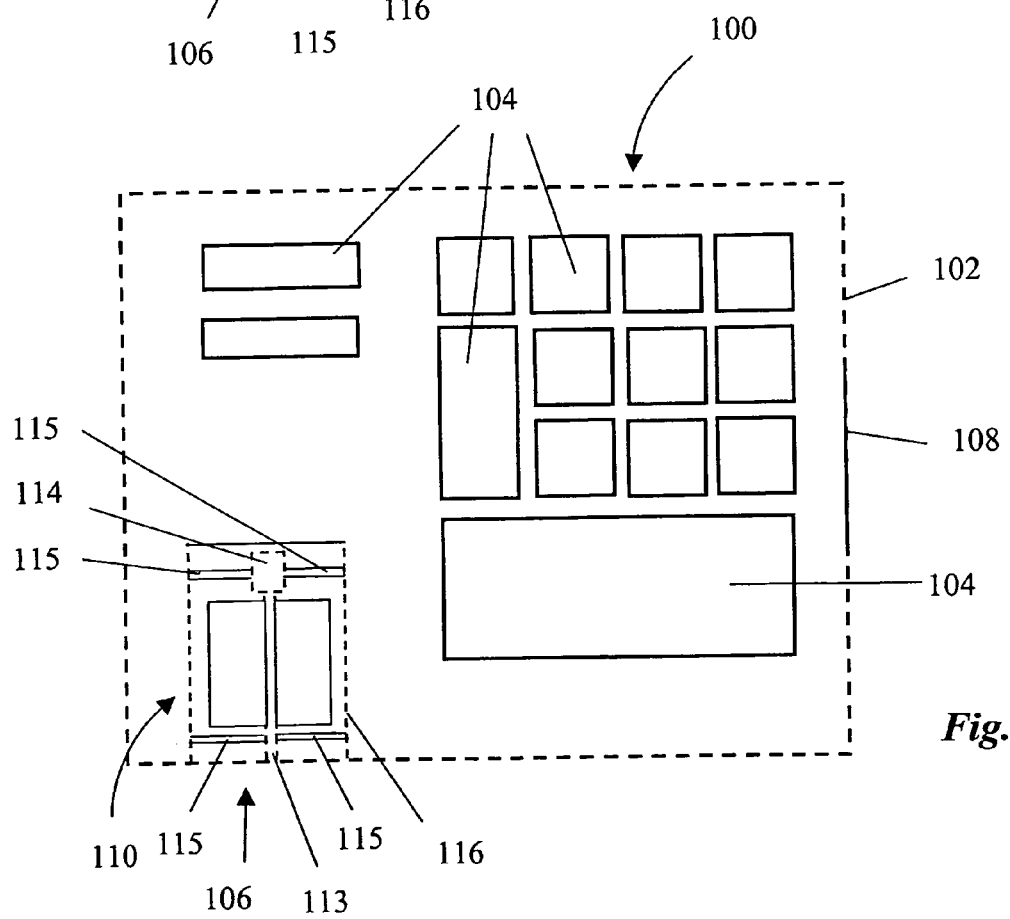
FIG. 1B is cross-sectional view of the ventilated casing shown in FIG. 1A.

Referring initially to FIGS. 1A and 1B, a ventilated casing for an electronic device according to an embodiment is now described. FIG. 1A shows a perspective view of ventilated casing 100 for an electronic device and FIG. 1B shows a cross-sectional view of the ventilated casing 100. In this embodiment the ventilated casing 100 is provided with electronic components 104. The ventilated casing 100 with the electronic components 104 form an electronic device. The ventilated casing 100 includes a housing 102 in which the electronic components 104 are positioned. The housing 102 has air inlet opening 106 and an air outlet opening 108.

For example, the ventilated casing 100 may be a casing for a server blade which may be positioned, together with a large number of other blades, in a rack. In a specific example, the casing 100 has a height of 1 U which corresponds to 1.75 inches or 4.445 cm. The casing 100 typically includes a large number of the electronic components 104, such as server electronic components. Such a 1 U server blade has the advantage that it uses only minimum space. However, if the electronic components 104 are closely packed, the heat that is generated per volume may be substantial. In this case cooling provided by a conventional fan in a conventional ventilated casing may not be sufficient. Further, if the electronic components 104 are densely packed in the confined interior space of the housing 102, the air pressure of a conventional fan may not be sufficient.

In this embodiment, the ventilated casing 100 includes a high speed axial fan 110 having blades 112 positioned on a shaft 113. The fan 110 has a motor 114 and an air guiding portion which includes a cowling 116 connected to a support 115 which supports the shaft 113. In this example the fan 110 has an operation speed of approximately 36,000 rpm. In general a suitable high speed fan has a normal operation speed that is greater than 3,600 rpm, such as greater than 10,000 rpm, 20,000 rpm or 30,000 rpm. Because of the high speed, the fan 110 provides high mass flow of cooling air. In a variation of this embodiment, the casing 100 may include two or more fans 110 which would provide even more cooling air. Further, in this embodiment the fan 110 has relatively deep blades 112 (the fan 110 has depth that is larger than the width of the fan 110). Consequently, due to the depth of the blades 112, high pressure is provided for ventilating densely packed casings. The fan 110 has an air guiding portion which in this embodiment is provided in form of a cowling 116.

In use, the fan 110 transports ventilation air from ventilation inlet opening 106 through the interior space of the ventilated casing 100 and through the ventilation opening 108. However, in operation the "turbine" fan 110 develops a relatively loud and disturbing noise. For example, if the fan 110 operates at a speed of 36,000 rpm, which corresponds to 600 rotations per second, mechanical vibrations having a frequency of approximately 600 Hertz are generated which causes the noise.

Fans of existing electronic devices often also cause vibrations, but since they operate at speeds that are significantly lower, typically of the order of 3600 rpm, the frequency of the vibration is much lower (60 Hertz), coupling of the vibration with surrounding parts is less likely and the generated noise is less disturbing. The noise having a frequency of approximately 600 Hz that is generated by the fan 110 of the ventilated casing 100, however, is in a frequency range to which the human ear has a relatively high sensitivity. Further, mechanical components of the ventilated casing 100 may have resonant frequencies that are in the proximity of this frequency and their vibrations would cause an amplification of the noise.

To reduce vibrations (and transmission of vibrations) and thereby to reduce the noise, the cowling 116 and the support 115 are designed so that the first mode resonance frequency of the cowling 116 connected to the support 115 is higher than the rotational frequency of the fan 110. For example, the rotational frequency of the fan 110 may be 600 rps. In this case the cowling 116 is designed so that the first mode resonance frequency is greater than 600 Hz. Further, in this embodiment the cowling 116 is designed so that the second and third mode resonance frequencies of the cowling 116 do not coincide with multiples of the rotational frequency of the fan. Therefore the design of the cowling 116 connected to the support 115 avoids resonant coupling between the fan blades 112 and the cowling 116. Consequently, vibration of the cowling 116, and thereby transmission of vibration from the cowling to other components, is reduced.

The ventilated casing 100 therefore has the significant advantage that sufficient cooling for densely packaged electronic components 104 may be provided while the noise is significantly reduced. It is to be appreciated that in a variation of this embodiment the cowling 116 also may be designed so that the rotational frequency of the fan 110 is greater than the resonance frequency of the cowling 116.

The resonant frequency of the cowling 116 connected to support 115 depends on the ratio of mass and the stiffness. Stiffness is directly proportional to modulus of elasticity. The resonance frequency of the cowling 116 can be increased compared with an aluminium cowling by choosing a material for the cowling that is of a lower density than aluminium and/or that has a higher modulus of elasticity than aluminium. Alternatively, the resonance frequency of the cowling 116 may be increased by providing stiffening features such as ribs or corrugations which increase the stiffness of the cowling 116.

The high speed rotation of the shaft 113 in the support 115 may result in gyroscopic precession and interaction of the blade 112 with the cowling 116 blade due to deflection of the shaft 113 when the casing 100 is tilted. In addition, a gyroscopic moment can result in a phenomenon referred to as "whirl mode" which is a phenomenon resulting from deflections induced by the gyroscopic moment. The deflections can result in oscillations that occur at the support structure 115 which may result in noise and/or destruction. Whirling may also be induced due to eccentricity. In this embodiment the support 115 provides sufficient stiffness and is located relative to the shaft 113 so that deflection is minimised. In this embodiment, the support 115 is composed of the same type of material as the cowling 116.

Figure 2:
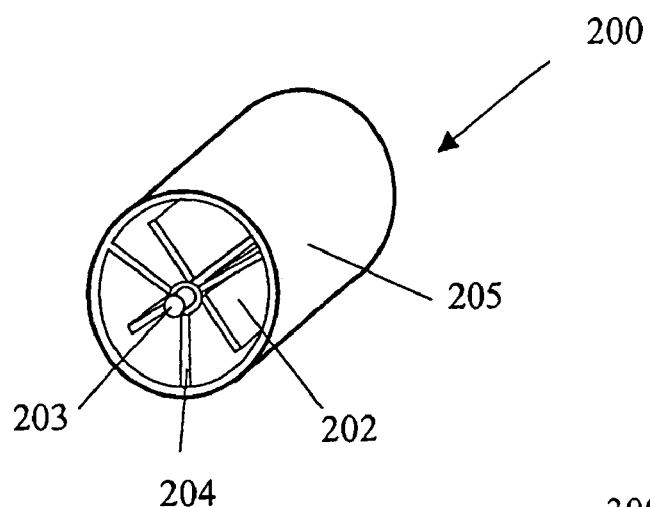
FIG. 2 is a perspective view of a fan according to an embodiment of the present invention.

FIG. 2 shows a high-speed fan 200 according to an embodiment. The fan 200 may replace the fan 110 shown in FIG. 1. The fan 200 includes a blade 202 on a shaft 203, supported by a support 204 and a motor (not shown). The fan also includes a cowling 205. In this embodiment the fan 200 is a high speed fan having an operation speed of 36,000 rpm and the cowling 204 is composed of cast magnesium alloy which has a lower density that of aluminium—approximately 1800 kg/m$^3$ compared to aluminium alloy of approximately 2700 kg/m$^3$. Alternatively, the cowling 205 may be composed for example of, thixomolded magnesium, graphite epoxy composite with low density and high modulus of elasticity, or cast magnesium with a porosity that is selected so that a suitable stiffness to mass ratio is obtained, a metal injection molded plastics material or any suitable ceramics material including $Al_2O_3$ and AlN or metal matrix composite material such as silicon carbide or aluminium silicon carbide.

Figure 3:
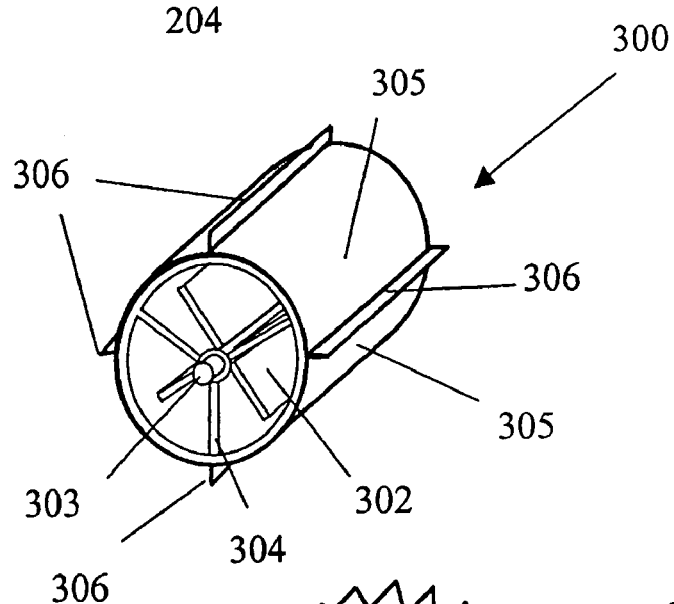
FIG. 3 is a perspective view of a fan according to another embodiment of the present invention.

FIG. 3 shows a high-speed fan 300 according to another embodiment. The fan 300 may also replace the fan 110 shown in FIG. 1. The fan 300 includes a blade 302 on a shaft 303, supported by a support 304 and a motor (not shown). The fan also includes a cowling 305. In this embodiment the fan 300 is a high speed fan having an operation speed of 36,000 rpm and the cowling 305 includes stiffening formations which in this example take the form of ribs 306. The cowling 305 therefore includes structural features, the ribs 306, which increase the stiffness of the cowling 305. In this example the cowling may be composed of any suitable material including Al, magnesium, graphite epoxy, cast magnesium with a porosity that is selected so that a suitable stiffness to mass ratio is obtained, a metal injection molded plastics material or any suitable ceramics material including $Al_2O_3$ and AlN or metal matrix composite material such as silicon carbide or aluminium silicon carbide. The ribs 306 may be integrally formed with the reminding components of the cowling 305. Alternatively, the ribs may be applied to a base surface of the cowling 305. For example, the ribs 306 may also be formed by bending U-shaped portions from the base surface in a manner such that a slot or a "bead" is formed adjacent each rib 306.

It is to be appreciated that the ribs 306 may take any suitable form and may not necessarily extend along the entire length of the cowling 305. Further, the ribs 306 may not necessarily be longitudinal ribs but may be oriented at least in part in a transversal direction. The fan 300 may include any number of ribs which may be placed inside or outside of the cowling 304 in a regular or irregular manner.

Figure 4:
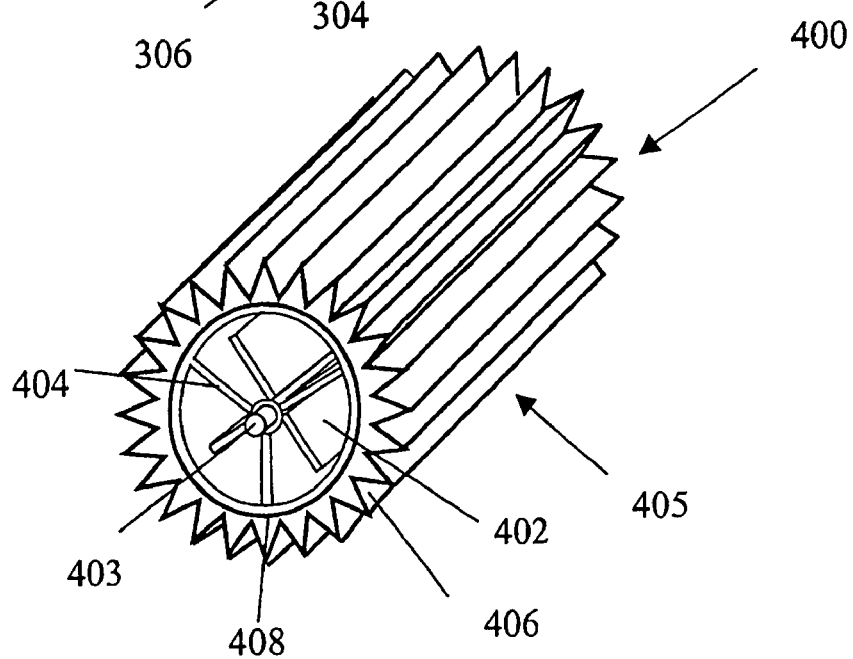
FIG. 4 is a perspective view of a fan according to a further embodiment of the present invention.

FIG. 4 shows a high-speed fan 400 according to another embodiment. The fan 400 may replace the fan 110 shown in FIG. 1. The fan 400 includes a blade 402 on a shaft 403, supported by a support 404 and a motor (not shown). The fan also includes a cowling 405. Again, the fan 400 is a high speed fan having an operation speed of 36,000 rpm. In this embodiment the cowling 405 includes a corrugated surface 406 which increases the stiffness of the cowling 405. In this example the corrugated surface is applied to a base surface 408. The cowling 405 may be composed any suitable material including Al, magnesium, graphite epoxy, cast magnesium with a porosity that is selected so that a suitable stiffness to mass ratio is obtained, a metal injection molded plastics material or any suitable ceramics material including $Al_2O_3$ and AlN or a metal matrix composite such as silicon carbide or aluminium silicon carbide.

Alternatively, the base surface 408 and the corrugated surface 406 may also be integrally formed. The corrugated surface 406 and the base surface 408 may also be a part of a honey-comb structure. It is also to be appreciated that in variations of this embodiment only a portion of the cowling 405 may have a corrugated surface. Further, the cowling may not include a base surface and the corrugated surface 405 may include inner and outer corrugated surfaces which provide inner and outer surfaces of the cowling. The corrugation may take any suitable form which may be regular or irregular and the corrugation may also have rounded edges.

Figure 5:
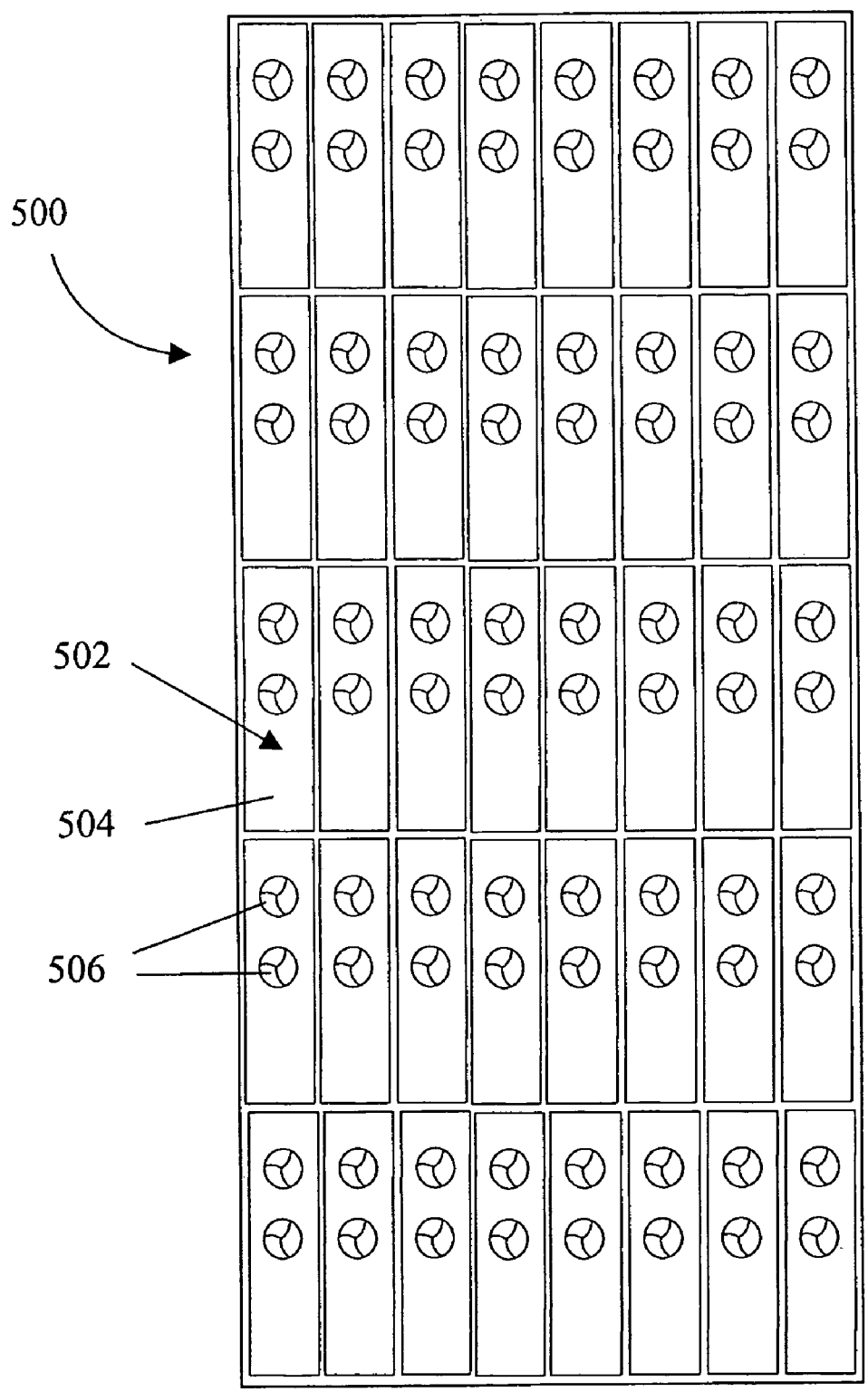
FIG. 5 is a rear view of a rack with ventilated casings for electronic devices according to a further embodiment of the present invention.

FIG. 5 shows a rear view of a rack 500 including a plurality of server blades 502. Each server blade 502 includes a ventilated casing 504 which in this embodiment includes two fans 506, each of which being identical with the fan 110, 200, 300 or 400 shown in FIGS. 1 to 4. In this embodiment, a large number of the server blades 502 are positioned closely packed in the rack 500.

Although the invention has been described with reference to particular examples, it will be appreciated by those skilled in the art that the invention may be embodied in many other forms. For example, it is to be appreciated that the fan may not necessarily be a high speed and high pressure fan of the type discussed above. For example, if the electronic components are less densely packed, it would be sufficient to use a fan that operates at a lower speed and provide less pressure. Also more than one fan may be stacked behind each other. In addition, the ventilated casing may not necessarily be a casing that is arranged to be positioned in a rack such as rack 400. For example, in an alternative embodiment, the ventilated casing may be a casing of a laptop computer or may be of any other size and shape. In addition, it is to be appreciated that the air guiding portion may take any suitable form and, if the air guiding portion includes a cowling, the cowling may not necessarily be connected to a support that supports a shaft of a fan or any other components of the fan.

What claimed is:

1. A ventilated casing for an electronic device, the ventilated casing composing:
   a housing having a ventilation inlet and a ventilation outlet; and
   a high speed fan for moving air from the ventilation inlet to the ventilation outlet to dissipate heat that in use is generated by electronic components positioned in the housing, the fan having a blade, a motor and an air guiding portion positioned near the blade,
   wherein the air guiding portion has a first mode resonance frequency that is greater than the rotational frequency of the fan.

2. The ventilated casing of claim 1 wherein:
   the air guiding portion has a second mode resonance frequency and a third mode resonance frequency, and wherein multiples of the rotational frequency of the fan do not coincide with the second or the third mode resonance frequency of the air guiding portion.

3. The ventilated casing of claim 1 wherein:
   the air guiding portion is at least in part composed of a material having an elasticity modulus E and a density D and wherein a ratio E/D for the material is larger than a corresponding ratio for aluminium.

4. The ventilated casing of claim 3 wherein: the air guiding portion is a cowling.

5. The ventilated casing of claim 3 wherein: the density D is smaller than the density of aluminium.

6. The ventilated casing of claim 3 wherein: the elasticity modulus E is larger than the elasticity modulus of aluminium.

7. The ventilated casing of claim 3 wherein the material is one of a metal, a metal injection molded plastics material and a ceramics material.

8. The ventilated casing of claim 3 wherein the material is one of cast Mg, thixomolded, Mg, AlN, Al.sub.2O.sub.3, cast magnesium, silicon carbide and aluminium silicon carbide.

9. The ventilated casing of claim 1 wherein:
   the air guiding portion comprises a surface that has stiffening formations which increase the stiffness of the air guiding portion.

10. The ventilated casing as claimed in claim 9 wherein:
    the stiffening formations comprise ribs.

11. The ventilated casing as claimed in claim 9 wherein:
    the stiffening formation comprises a corrugation.

12. The ventilated casing of claim 1 wherein:
    the fan has an operating speed of more than 15,000 rpm.

13. The ventilated casing of claim 1 wherein:
    the fan has an operating speed of more than 30,000 rpm.

14. The ventilated casing of claim 1 wherein:
    the air-guiding portion is a cowling that surrounds the blade.

15. A blade-casing for an electronic device, the blade-casing comprising:
    a housing having a ventilation inlet and a ventilation outlet; and
    a high speed fan for moving air from the ventilation inlet to the ventilation outlet to dissipate heat that in use is generated by electronic components positioned in the housing, the fan having a blade, a motor and an air guiding portion positioned near the blade;
    wherein the air guiding portion has a first mode resonance frequency that is greater than the rotational frequency of the fan.

16. The blade-casing of claim 15 wherein:
    the housing has substantially the shape of a rectangular prism and is shaped for placement in a 1 U rack system.

17. A ventilated casing for an electronic device, the ventilated casing comprising:
    a housing having a ventilation inlet and a ventilation outlet; and
    a high speed axial fan for moving air from the ventilation inlet to the ventilation outlet to dissipate heat that in use is generated by electronic components positioned in the housing, the fan having a bade, a motor and an air guiding portion positioned near the blade;
    wherein the high speed axial fan has an operation speed of more than 15,000 rpm.

18. The ventilated casing of claim 17 wherein the high speed fan has an operation speed of more than 30,000 rpm.

19. The blade-casing as claimed in claim 15, wherein: the high speed fan is an axial fan.

20. The ventilated casing as claimed in claim 1, wherein: the high speed fan is an axial fan.

21. A ventilated casing for an electronic device, the ventilated casing comprising:
    a housing having a ventilation inlet and a ventilation outlet; and
    a high speed fan for moving air from the ventilation inlet to the ventilation outlet to dissipate heat that in use is generated by electronic components positioned in the housing, the fan having a blade, a motor and an air guiding portion positioned near the blade;

wherein the air guiding portion comprises a surface that has stiffening formations that increase the stiffness of the air guiding portion.

22. The ventilated casing as claimed in claim 21 wherein: the stiffening formations comprise ribs.

23. The ventilated casing as claimed in claim 21 wherein: the stiffening formation comprises a corrugation.

24. The ventilated casing as claimed in claim 21 wherein: the increased stiffness of the air guiding portion provides for an increased first mode resonance frequency.

25. The ventilated casing as claimed in claim 21, wherein: the high speed fan is an axial fan.

* * * * *

UNITED STATES PATENT AND TRADEMARK OFFICE
CERTIFICATE OF CORRECTION

| | |
|---|---|
| PATENT NO. | : 7,126,821 B2 |
| APPLICATION NO. | : 10/990181 |
| DATED | : October 24, 2006 |
| INVENTOR(S) | : Chandrakant D. Patel et al. |

It is certified that error appears in the above-identified patent and that said Letters Patent is hereby corrected as shown below:

In column 5, line 38, in Claim 1, delete "composing:" and insert -- comprising: --, therefor.

Signed and Sealed this

Twenty-second Day of December, 2009

David J. Kappos
*Director of the United States Patent and Trademark Office*